United States Patent [19]
Alcoe et al.

[11] Patent Number: 5,877,043
[45] Date of Patent: Mar. 2, 1999

[54] ELECTRONIC PACKAGE WITH STRAIN RELIEF MEANS AND METHOD OF MAKING

[75] Inventors: David James Alcoe, Vestal; Steven Wayne Anderson, Endicott; Yifan Guo, Vestal; Eric Arthur Johnson, Greene, all of N.Y.

[73] Assignee: International Business Machines Corporation, Armonk, N.Y.

[21] Appl. No.: 28,014

[22] Filed: Feb. 23, 1998

Related U.S. Application Data

[62] Division of Ser. No. 595,108, Feb. 1, 1996, Pat. No. 5,760,465.

[51] Int. Cl.⁶ .................................................... H01L 21/44
[52] U.S. Cl. ............................................ 438/123; 438/125
[58] Field of Search ..................... 438/106, 121, 438/123, 125

[56] References Cited

U.S. PATENT DOCUMENTS

| | | |
|---|---|---|
| 4,873,123 | 10/1989 | Canestaro et al. . |
| 5,016,084 | 5/1991 | Nakao ...................................... 438/123 |
| 5,168,430 | 12/1992 | Nitsch et al. . |
| 5,278,724 | 1/1994 | Angulas et al. . |
| 5,340,771 | 8/1994 | Rostoker .................................. 438/125 |
| 5,352,632 | 10/1994 | Sawaya ..................................... 438/123 |
| 5,383,787 | 1/1995 | Switky et al. . |
| 5,383,788 | 1/1995 | Spencer . |
| 5,386,341 | 1/1995 | Olson et al. . |
| 5,397,921 | 3/1995 | Karnezos . |
| 5,435,732 | 7/1995 | Angulas et al. . |
| 5,474,957 | 12/1995 | Urashima ................................. 438/123 |
| 5,756,380 | 5/1998 | Berg et al. ............................... 438/125 |

FOREIGN PATENT DOCUMENTS

| | | |
|---|---|---|
| 0613336 | 8/1994 | European Pat. Off. . |
| 0314884 | 12/1988 | Japan . |
| 0157588 | 5/1989 | Japan . |
| 2116370 | 9/1983 | United Kingdom . |

*Primary Examiner*—Kevin M. Picardat
*Attorney, Agent, or Firm*—Lawrence R. Fraley

[57] ABSTRACT

An electronic package which includes a flexible substrate, stiffener and chip. The chip is bonded to the substrate, which was secured to the stiffener. Strain relief means are utilized at various locations in the package to prevent problems (e.g., tape "wrinkling") associated with relatively large differences in coefficients of thermal expansion between the package's various elements.

15 Claims, 8 Drawing Sheets

ELECTRONIC PACKAGE WITH STRAIN RELIEF MEANS AND METHOD OF MAKING

This application is a divisional of U.S. Ser. No. 08/595,108, filed Feb. 1, 1996, now U.S. Pat. No. 5,760,465.

TECHNICAL FIELD

This invention relates to electronic packages and particularly those which utilize flexible circuitry and semiconductor devices (chips). Such packages may be used in such products as information handling systems (computers).

BACKGROUND OF THE INVENTION

Electronic packages of the variety described above are known in the art. Examples are defined in detail in U.S. Pat. Nos. 5,435,732 (Angulas et al), 5,397,921 (Karnezos), 5,386,341 (Olson et al), 5,278,724 (Angulas et al), 4,873,123 (Canestaro et al) and 5,383,787 (Switky et al).

As defined therein, such packages typically include a semiconductor device (chip) electrically coupled to one side of a circuitized substrate such as a flexible circuit member, which typically comprises a dielectric, e.g., polyimide, having at least one layer of circuitry, e.g., copper thereon. Such a chip may be coupled, electrically, to the flexible circuit member's circuitry using solder. See, e.g., U.S. Pat. No. 5,435,732 at FIG. 10. A well-known technique for accomplishing such a solder coupling includes what is known in the industry as a controlled collapse chip connection (C4) procedure. Another known process is a thermal compression bonding (TCB) procedure. Because both processes are known, further description is not believed necessary. The flexible circuitry (often called a tape) may then be coupled electrically to respective circuitry, e.g. copper pads or lines, formed on the surfaces of a circuitized substrate, such as another flex circuit, a more rigid printed circuit board, a ceramic substrate, or the like. Circuit boards, usually comprised of several layers of dielectric material, e.g., fiberglass-reinforced epoxy resin, interspersed with various conductor levels, e.g., power, signal and/or ground planes, and often including plated through-holes and/or internal conductive vias, are known in the art and further definition is not believed necessary.

The above packages also typically utilize a heat sink member which is thermally coupled to the package's chip, the heat sink being located slightly above the chip and provided with a good thermal path to the chip to enhance heat removal from the completed package (most particularly the chip) during package operation. Such heat sinks usually comprise a metallic element located on the package in such a position as to facilitate thermal removal by interaction with a cooling airflow or, simply, relatively non-moving ambient air. The heat sink may be attached to the chip with an appropriate thermal adhesive, several of which are known in the art. To further promote heat removal, the heat sink typically includes appropriate fins, pins, or the like at various locations. The heat sink may also be of a multilayer (or multilevel) design, where each level of the heat sink is optimized for a particular function. The first level of the heat sink may be designed to optimize the thermal contact with the chip and the removal and spreading of heat from the chip, along with the function of protecting the chip and attached circuitry from chemical or other contact from various manufacturing processes. The heat sink's second level may be optimized for thermal interaction with cooling fluid flow (gas or liquid) to provide additional thermal efficiency if demanded by a particular application. This second level of the heat sink may be a separate element, attached to the first level structure by thermal adhesive. It is possible that the first heat sink level may comprise a low-profile, platelike member with the second level including a plurality of fins so that in combination, very high rates of heat removal may be realized. However, if very high thermal performance is not needed, the second level of heat sink may be omitted.

In U.S. Pat. No. 5,397,921, an example is shown of a chip electrically connected to a tape by at least two methods. A one-level heat sink design is used, with the heat sink material chosen to be a specifically designed metallic compound so as to match the coefficient of thermal expansion (CTE) of the heat sink to that of the chip. However, such a choice will not adequately match the CTE of the tape to the chip. Since the chip is bonded to the tape, there exists a mismatch in expansion coefficients, and thus thermally-induced stresses will occur on the circuitry of the tape. Such stresses, typically the result of temperature changes during package operation, can adversely affect the package, including possibly rendering it inoperative.

To utilize various thermal epoxies for heat sink attachment, the temperature of the entire package must be elevated during production in order to cure the epoxy into a useful material state. Because of the mismatch of thermal expansion coefficients between the tape and chip, high tensile stresses are thus created between the chip and the bulk of the tape. These stresses have occasionally resulted in wrinkling of the tape, which in turn results in substantial, unpredictable, and uncontrollable non-planarity of portions of the tape. Such non-planarity can interfere with subsequent electrical connection procedures involving the package's circuitry. Such interference can be great enough to render the package unusable or can contribute to unreliable subsequent electrical connections. This mechanism of failure is further aggravated by the use of larger size chips which are considered necessary in many of today's electronic package assemblies in order to assure enhanced operational capabilities demanded of such structures.

It is also known that some procedures of electrically connecting the chip to the circuitry of the tape (a/k/a chip bonding) require the use of substantially elevated chip temperatures. A primary example is the aforementioned TCB procedure, which requires relatively high temperatures and pressures to satisfactorily effect chip and tape connections. As the connection is formed, the temperature of the chip is significantly greater than that of the bulk of the tape. Subsequent cooling of the bonded chip and tape results in high tensile stresses between both elements. As mentioned, such stresses have been found of sufficient magnitude to induce wrinkles in the tape.

In accordance with the teachings of the present invention, it has been found that it is possible to avoid the condition of high tensile stresses, which cause the condition of tape wrinkling, by the use of strain relief means between the chip and the tape. Significantly, use of this invention permits the highly advantageous utilization of larger and more complex chips in such electronic packages, thereby advancing the art of electronics and electronic packaging in general. Further, such use of strain relief in turn permits the use of a wide variety of high-temperature cured thermal adhesives with such larger chips, while preventing tape wrinkling.

For a chip package to accommodate numerous sizes, designs and types of chips, it is not always possible to precisely know what the effective CTE of a chip will be. Therefore, it is not possible to choose the heat sink material CTE to match that of the chip, as there is known to be a range of chip material CTE values depending on the exact chip material composition (e.g., silicon or gallium arsenide), processing and coating of the chip material, and the extent of circuitry on the chip. Even if the CTE of the heat sink material was perfectly matched to that of the chip, temperature gradients or differences between the heat sink and the chip may cause an unacceptable expansion mismatch. Thus, for a variety of practical reasons, there will in general exist a mismatch of expansion between the chip and the heat sink, giving rise to thermally induced stresses in any thermal epoxy used to bond the two members. As understood, these stresses can be substantial, causing fracture, debonding, and loss of thermal contact between heat sink and chip. Such conditions may also lead to chip overheating and disconnection from the tape. In order to avoid these failures, the present invention also details a means of reducing these stresses and improving the adhesion between the adhesive and heat sink, if such adhesive is utilized. Further, a simple means of providing additional support and bracing to promote contact between the chip and heat sink is described. This additional support can be necessary if a relatively large, massive heat sink is required, and the strength of the thermal adhesive (e.g., epoxy) alone is not sufficient. As understood from the following, implementation of this invention will enable the successful use of relatively large, heavy heat sinks, made of a heat sink material which is not necessarily chosen to be a particular match to any of a wide variety of large, complex, and varied chips.

Because the chip is bonded to the tape, and there exists a relatively significant mismatch in expansion coefficients, small thermally-induced stresses can occur during use of the tape's circuitry. These stresses are not necessarily of the high tensile nature described above (which can cause wrinkling), but instead are relatively small and may occur at the location of the circuitry on the tape that is directly coupled to the chip. The action of heating an electronic package and subsequently cooling thereof is known as thermal cycling. It is known that even very small stresses can induce fatigue fracture in the circuitry after a relatively large number of such cycles, such fatigue fracture possibly resulting in a loss of electrical conductivity of a circuit line (and thus failure of the entire package). To reduce these stresses, it has been found that providing a fillet of a particular configuration can also be effective as stress relief means. These stresses can also be redirected away from circuit lines near the chip (which are relatively fine and narrow) to more robust electrical lines farther away from the chip, using the teachings of the invention.

It is believed that an electronic package assembly possessing the above and other advantageous features which is thus capable of overcoming the several aforementioned problems, and a method of making such a package assembly, would constitute significant advancements in the art.

OBJECTS AND SUMMARY OF THE INVENTION

It is, therefore, a primary object of the present invention to enhance the art of electronic packages and particularly those packages for use in the computer industry.

It is another object of the invention to provide an electronic package which overcomes the aforementioned disadvantages of various known packages.

It is a still further object of the invention to provide an electronic package which can be produced in a relatively inexpensive manner, and which is adaptable to mass production techniques for such packages.

In accordance with one aspect of the invention, there is defined an electronic package which includes a stiffener member, a flexible circuitized substrate secured to the stiffener member, and a semiconductor device. The flexible circuitized substrate includes at least one dielectric layer and at least one conductive layer with a plurality of signal lines, with selected lines having a projecting lead portion. The semiconductor device is electrically connected to selected ones of the projecting lead portions and selected ones of the plurality of signal lines on the flexible circuitized substrate are each adapted for being electrically connected to an external conductive element. The improvement to the electronic package comprises the inclusion of strain relief means in the projecting lead portions at a location adjacent the connection between the lead portions and the semiconductor device.

In accordance with another aspect of the invention, there is provided a method of making an electronic package which comprises the steps of providing a stiffener member, securing a flexible circuitized substrate to the stiffener member, the substrate including at least one dielectric layer and at least one conductive layer located on the dielectric layer and including a plurality of signal lines each having a projecting lead portion adapted for being electrically coupled to an external conductive element when the element is positioned on the flexible circuitized substrate, spacedly positioning a semiconductor device relative to the stiffener member and electrically coupling the semiconductor device to the projecting lead portions of the flexible circuitized substrate. Significantly, the method as taught herein further includes the step of providing strain relief means in the flexible circuitized substrate at a location relative to the location of the electrical coupling between the semiconductor device and the projecting lead portions of the signal lines.

In accordance with yet another aspect of the invention, there is provided an information handling system comprising an electronic package including a stiffener member, a flexible circuitized substrate secured to the stiffener member and including at least a first dielectric layer, at least one conductive layer located on the first dielectric layer and including a plurality of signal lines each having a projecting lead portion as part thereof, which project a predetermined distance from the first dielectric layer, selected ones of the signal lines adapted for being electrically connected to respective ones of external conductive elements when the external conductive elements are positioned on the flexible circuitized substrate, and a semiconductor device including a plurality of contact sites thereon. Selected ones of the contact sites are electrically coupled to respective ones of the projecting lead portions of the signal lines and spacedly positioned from the stiffener, the projecting lead portions of the signal lines of the flexible circuitized substrate including strain relief means therein at a location adjacent the connection between the projecting lead portions and the contact sites of the semiconductor device.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from Figure to Figure.

Figure 1:
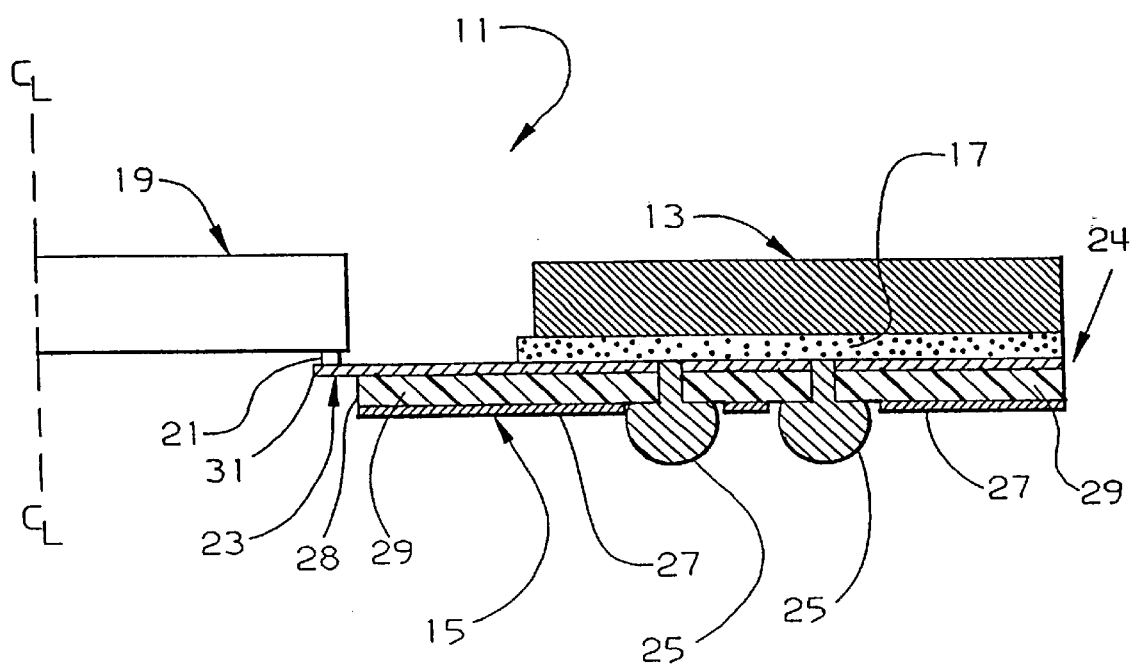
FIG. 1 is a partial, side sectional view, in elevation and on a much enlarged scale, of an electronic package of known construction. (It is understood herein that the center line CL—CL in all of the drawing Figures indicates a mirror image of the illustrated section exists to the left of said line. The partial views provided herein, all on an enlarged scale, are shown herein in such a manner for ease of illustration purposes)

In FIG. 1, there is shown an electronic package 11 of known configuration. Package 11 includes a stiffener member 13, a flexible circuitized substrate 15 secured to stiffener 13 (e.g., with adhesive 17), a semiconductor device 19 (e.g., a chip) electrically connected at contact sites 21 to selected signal lines 23 of conductive layer 24 of substrate 15, and external conductive elements 25 (e.g., solder balls).

It is understood that, although only one of each is shown, more than one contact site 21 and projecting lead portion 31 of signal lines 23 are preferably utilized in the invention. In one example, a total of 647 contact sites and lead portions were successfully used. Further, it is understood that chip 19 may include conductive sites around its entire periphery (typically of rectangular configuration) and that flexible circuitized substrate 15 may define an opening (e.g., below chip 19) of similar configuration as the chip but slightly wider, with projecting lead portions 23 extending from each of the circuit's dielectric layer's internal edges which define such an opening. Rectangular openings in flexible circuitry designed to accommodate rectangularly configured semiconductor chips are known in the art, and further description is not necessary.

Typical materials used in flexible circuitized substrate 15 include copper (or copper alloy) for the signal lines 23 and any associated ground plane 27 (if used), and polyimide for the flexible substrate's dielectric layer 29. Stiffener member 13 is typically copper or aluminum. Conductive elements 25 can be either high-melt (e.g., 90:10 which is 90 percent lead and 10 percent tin) solder or lower melting point (e.g., 37:63) solder. Adhesive 17 is typically a soft elastomeric film, and may be selected from several known adhesives in the field.

Figure 2:
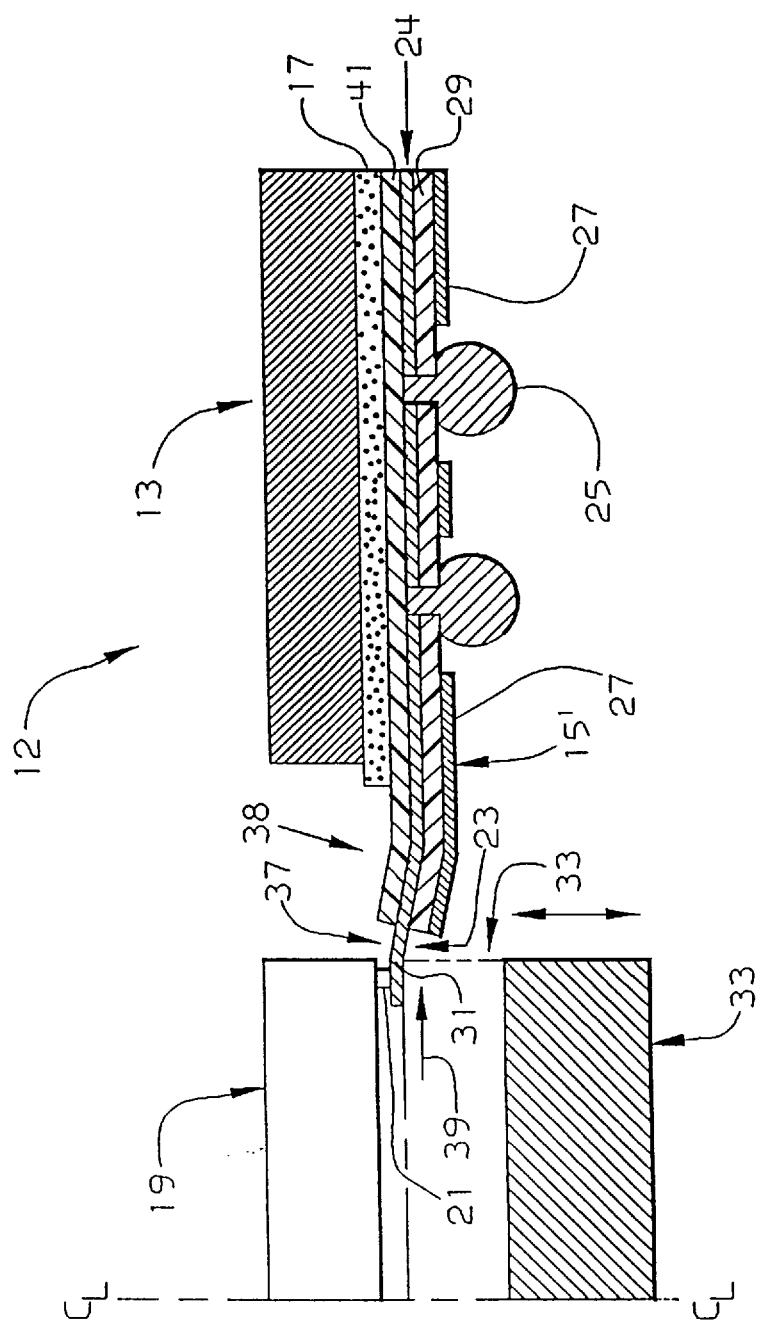
FIG. 2 is a partial side, sectional view of an electronic package in accordance with one embodiment of the invention. Strain relief means are included on projecting signal lead portions, and a bonding apparatus which can form the strain relief means and electrically connect the semiconductor device to the selected lead portions is depicted.

Chip 19 is electrically connected to the flexible substrate's signal lines 23 at the illustrated, respective contact sites 21. Such connection is to a small projecting portion of the signal line 23 which projects from beyond the internal edge 28 of the dielectric layer 29. Each projecting portion of lines 23 thus forms a projecting lead portion 31. In FIG. 1, no strain relief exists between chip 19 and the flexible substrate 15, due to the direct physical bond (connection) at contact site 21. The bond at site 21 is typically rapidly formed using a known thermal compression process with a known hot bonding apparatus 33 (e.g., as depicted in FIG. 2). Such a procedure normally only takes about one second, including connection of all sites simultaneously in this manner. In one example, a total of 647 sites have been bonded. During this procedure, the bulk (larger, remaining portion) of the substrate and the metal stiffener remain at or near room temperature. Subsequent heating of the entire package 11 may thus bring about high tensile stresses in the portion of the substrate 15 located immediately below the gap between the stiffener member 13 and chip 19, due primarily to the higher CTE of both the stiffener 13 and substrate 15 compared to that of the chip 19 (typically by a magnitude of about 5:1 to 7:1). Because of the lack of acceptable strain relief between chip 19 and substrate 15, a detrimental condition known as "wrinkling" may occur to the flexible circuitized substrate 15 due to these high tensile stresses. This wrinkled condition can even delaminate substrate 15 from adhesive 17, and also prevent successful utilization of external conductive elements 25 to form an electrical connection to external conductive elements, e.g., conductive pads, on a circuit board. (The pads (26) are only shown in FIG. 7 of the drawings, and are understood to lie on a circuitized substrate such as a printed circuit board 26' located below the embodiments in the drawings such that elements 25 each physically engage a respective pad to form a connection thereto. None of the other parts shown in the drawings physically engage the board in the final version of the invention.)

Figure 7:
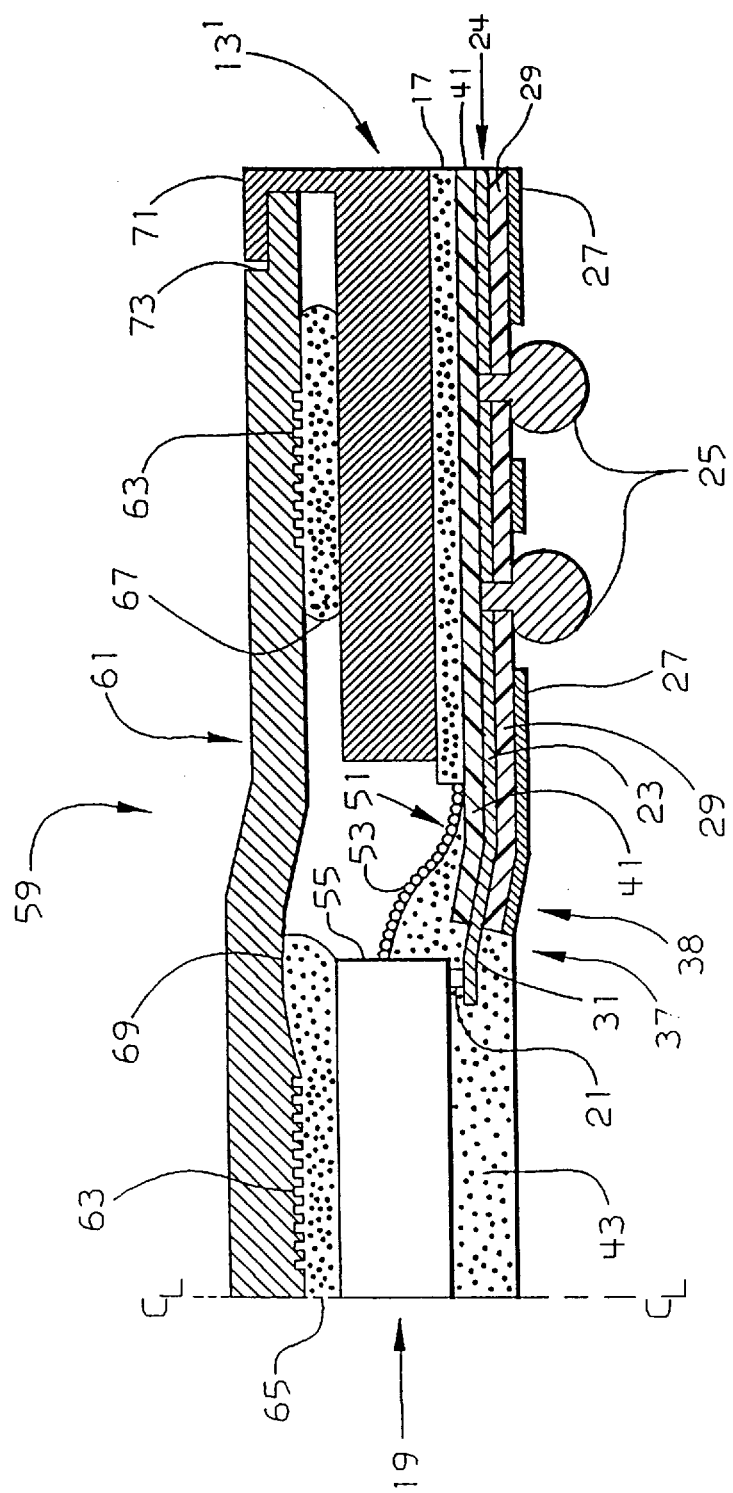
FIG. 7 is a partial side, sectional view of an electronic package in accordance with another embodiment of the invention, including a tapered protective coating on the semiconductor device such as shown above, and additional strain relief means for the invention's projecting lead portions. Also illustrated is another stress-reducing feature (this in the heat sink) near the semiconductor device's perimeter.

In FIG. 2, there is shown an electronic package 12 in accordance with one embodiment of this invention. Package 12 overcomes the aforementioned problem associated with wrinkling through the provision of strain relief means 37. Strain relief means 37 comprises a substantial bend of the projecting lead portion 31 relative to the regular plane of the substrate's circuitry 23 (and dielectric layer 29). Such a bend, or offset, can be rapidly and conveniently formed by modifying the alignment of known bonding apparatus 33. As the thermal compression bonding apparatus 33 moves to press the projecting lead portion 31 against the chip's contact site 21 (bonding apparatus 33 is shown in its withdrawn position in solid in FIG. 2, and in its advanced engagement position in phantom), the relatively weaker and more flexible projecting lead portion 31 is substantially bent upward toward the chip and, significantly, slightly moved back in the direction indicated by arrow 39. This simultaneous movement continues until the physical bond is formed at site 21, after which the bonding apparatus 33 is withdrawn, leaving the projecting lead portion 31 bent from its normally planar configuration and formed to include strain relief means 37. During this process, the flexible circuitized substrate 15 may similarly be formed to include an indentation 38, which further enhances strain relief at this location. Significantly, projecting lead portion 31 is also electrically connected at site 21 to chip 19. With strain relief means 37, relative movement between the chip and the stiffener resulting from subsequent heating of completed package 12 (e.g., as shown in FIG. 7) is substantially absorbed (accommodated) without high tensile stress generation in the aforementioned "window area" between stiffener 13 and the chip. Thus, wrinkling of the improved substrate 15' is substantially eliminated by the simultaneous action of forming strain relief means 37 and bonding the chip at site 21. The forming of indentation 38 of substrate 15 has similar effect. It is again worth mentioning that this action results in the projecting lead portion 31 being deflected and simultaneously withdrawn (arrow 39), while still assuring formation of an effective electrical connection between portion 31 and chip contact site 21.

Figure 2B:
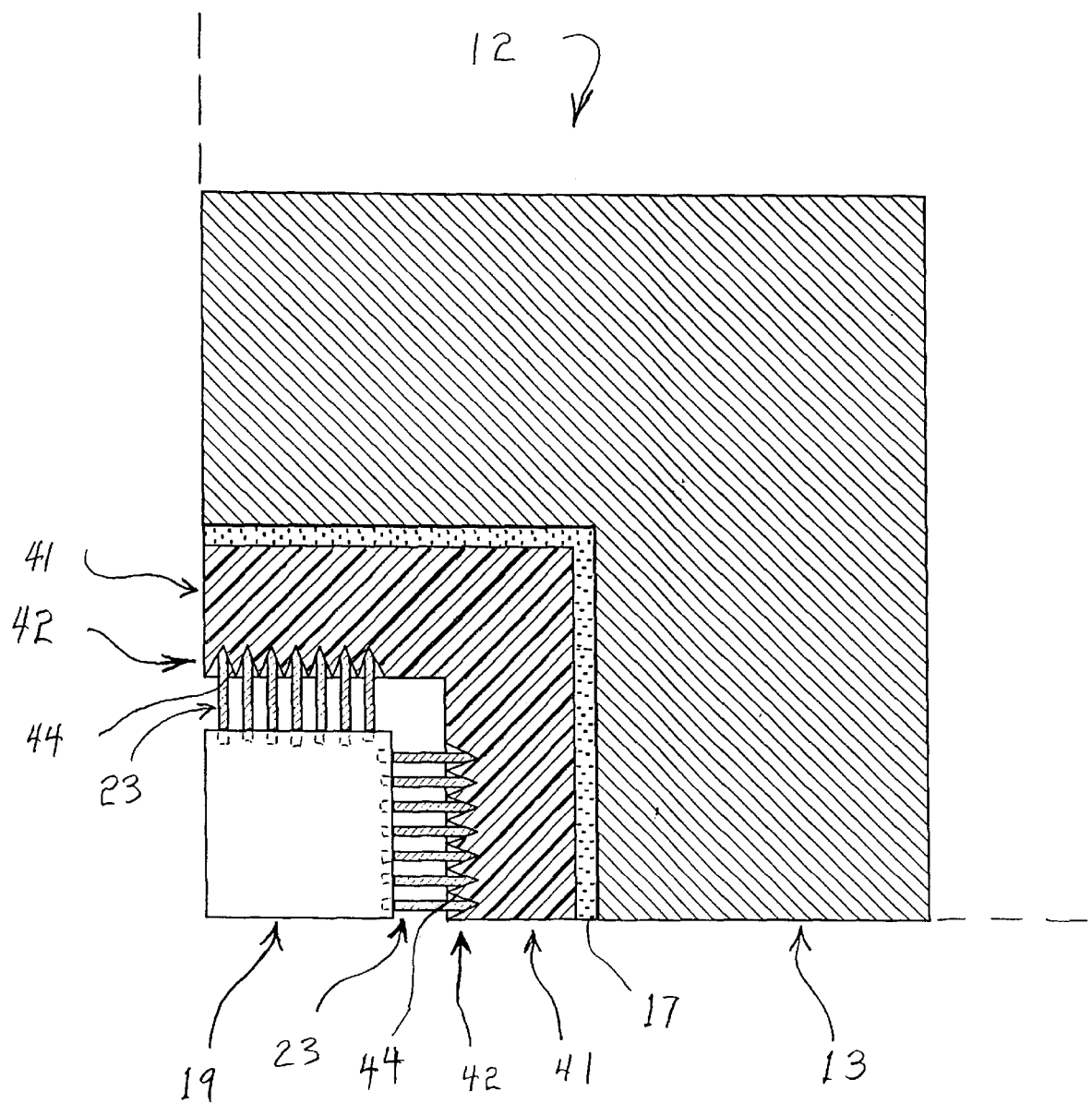
FIG. 2B is a partial plan, sectional view of a part of an electronic package in accordance with one embodiment of the invention. A feathered edge portion formed within a second layer of dielectric used to cover portions of the flexible circuit's signal lines is depicted.

In FIG. 2, there is shown a second dielectric layer 41, which can be included to further protect signal lines 23 from debris, chemicals, and the like as may be encountered during various manufacturing processes and utilization of the finished electronic package 12. This second dielectric layer can also be polyimide bonded with a known suitable adhesive to the underlying signal lines 23 and first dielectric layer 29. Layer 41 may also be a conforming film of protective adhesive known as solder mask material, e.g., Vacrel, typically 2 mils thick. (Vacrel is a trademark of E. I. DuPont deNemours & Company.) The inclusion of second dielectric layer 41 also has the added beneficial effect of stiffening and strengthening the flexible circuitized substrate 15' in the area (designated as "A" in FIG. 2) between chip 19 and stiffener 13. The transition of low stiffness from the unprotected projecting signal line portion 31 to high stiffness of the flexible circuitized substrate 15' can be made more gradual by including a feathered edge portion 42 (FIG. 2B). This gradual change in stiffness gives a gradual change in strain of the signal lines 23 across the feathered portion 42, thus avoiding an undesirable stress concentration from abrupt change in stiffness.

An illustration of such a feathered edge portion is shown in FIG. 2B, which shows the second dielectric layer coverlay fashioned into a series of tapered forward edge portions 44. FIG. 2B is a partial plan view, looking down on package 12 (from a position at the top in FIG. 2). The known methods of die-cutting, punching, or photoetching may be used to form the feathered edge portions. It is preferred that the number of tapered forward edge portions coincides with the number and placement of signal lines 23, specifically, one pair of tapered edges per line. Although tapered edges are shown, there are other patterns of edges which assure graduation of stiffness to avoid serious stress concentration, e.g., linear taper, parabolic taper, series of non-tapered features (like a comb), staggered rectangular, etc. The invention is thus not limited to the V-shaped tapers depicted. The choice of a linearly tapered feature appears most suitable for economical manufacture, however.

Also in FIG. 2, a region of moderated thermal expansivity 40 is depicted as part of ground plane 27. The CTE of the material in region 40 is chosen to be at least as great as that of chip 19, but no greater than the flexible circuitized substrate 15', so that the difference in thermal strain between the chip 19 and substrate 15' is significantly reduced in this critical area. The region 40 may include the entire substrate 15' or just an area surrounding the chip 19 as depicted in FIG. 2. There are numerous known materials suitable for this purpose, such as Invar or other iron-nickel compounds, nickel, chromium, tungsten, molybdenum, etc. which can be electroplated or sputtered onto the first dielectric layer 29 (along region 40) and/or the ground plane 27, so that the thermal strain difference is reduced in this region. Beyond region 40, (that area beneath stiffener 13), however, the thermal strain differential may be relatively increased, because, in the present design, the circuit lines 23 "fanout" and are therefore wider in size and thus more fatigue resistant. Also, the flexible circuitized substrate 15' is bonded to the stiffener 13 and thus better supported to avoid wrinkling.

Figure 3:
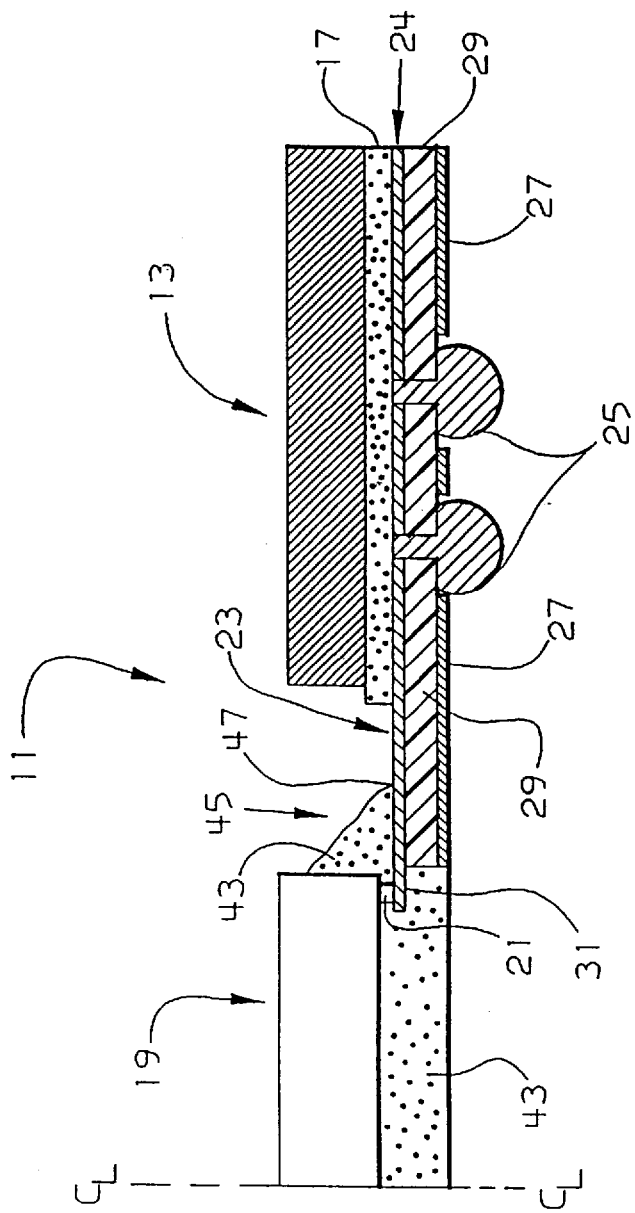
FIG. 3 is a partial side, sectional view of another electronic package of known construction, a protective coating on the semiconductor device being depicted.

In FIG. 3, there is illustrated the known electronic package 11 of FIG. 1 with the addition of a protective coating of encapsulant material 43 surrounding the sides and contact surfaces of chip 19, projecting lead portions 31, and contact sites 21. Suitable compositions of the encapsulant material are known in the art, and are typically a filled epoxy dispensed in viscous form followed by temperature cure to cause solidification.

Figure 4:
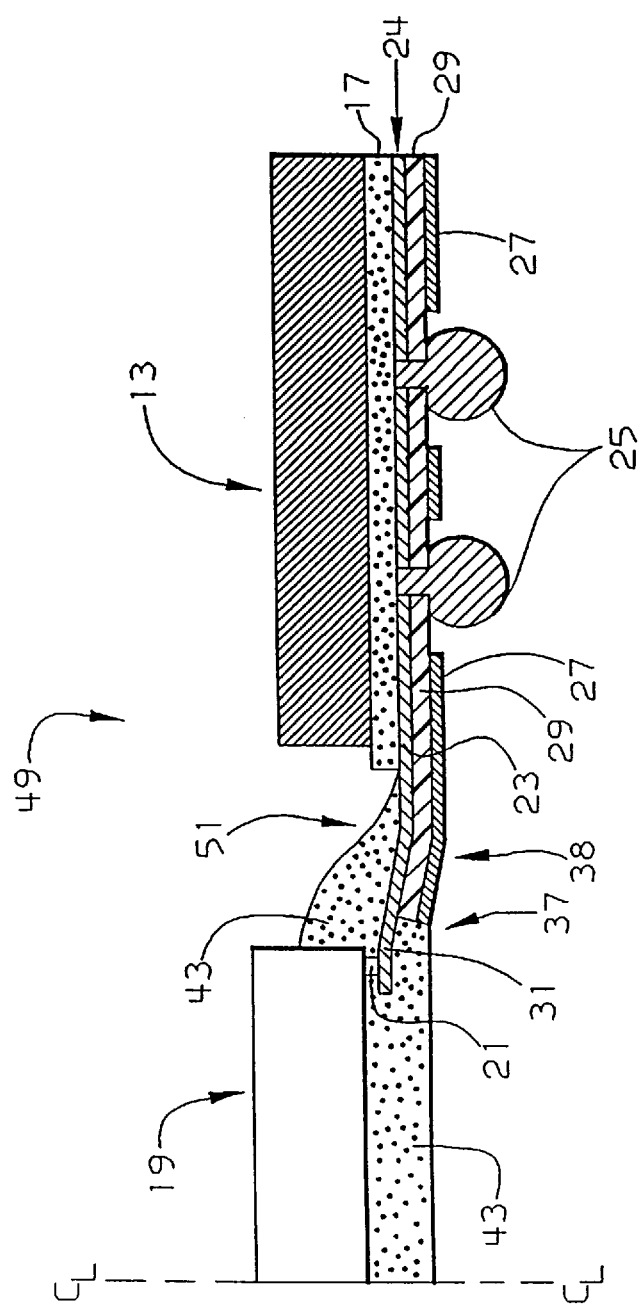
FIG. 4 is a partial side, sectional view of an electronic package in accordance with another embodiment of the invention. Strain relief means is depicted on the invention's projecting lead portions, while also shown is a tapered protective encapsulant coating to provide even further strain relief.

Typical encapsulant dispense processes known in the art can result in formation of a sharply ending, steep fillet 45 due to the viscosity of the uncured encapsulant material, as depicted in FIG. 3. This fillet shape, which sharply terminates about one-half the distance between chip and stiffener, has been found to be undesirable, because such sharpness (steepness) forcibly concentrates thermal expansion stress on circuit line 23 near the edge 47 of the fillet. In FIG. 4, there is depicted an improved electronic package 49 over the embodiment of FIG. 3. This package includes a chip 19, projecting lead portions 31 (only one shown), and contact sites 21 (only one shown) surrounded by encapsulant material 43, which has a substantially greater tapered fillet 51. The more gradual change of the encapsulant material thickness over circuit lines 23, thicker at the chip 19 while thinning as the distance from the chip increases, including to the point of intersection between the adhesive 17's forward edge and line 23, results in little or no thermal stress concentration on circuit lines 23.

Figure 5:
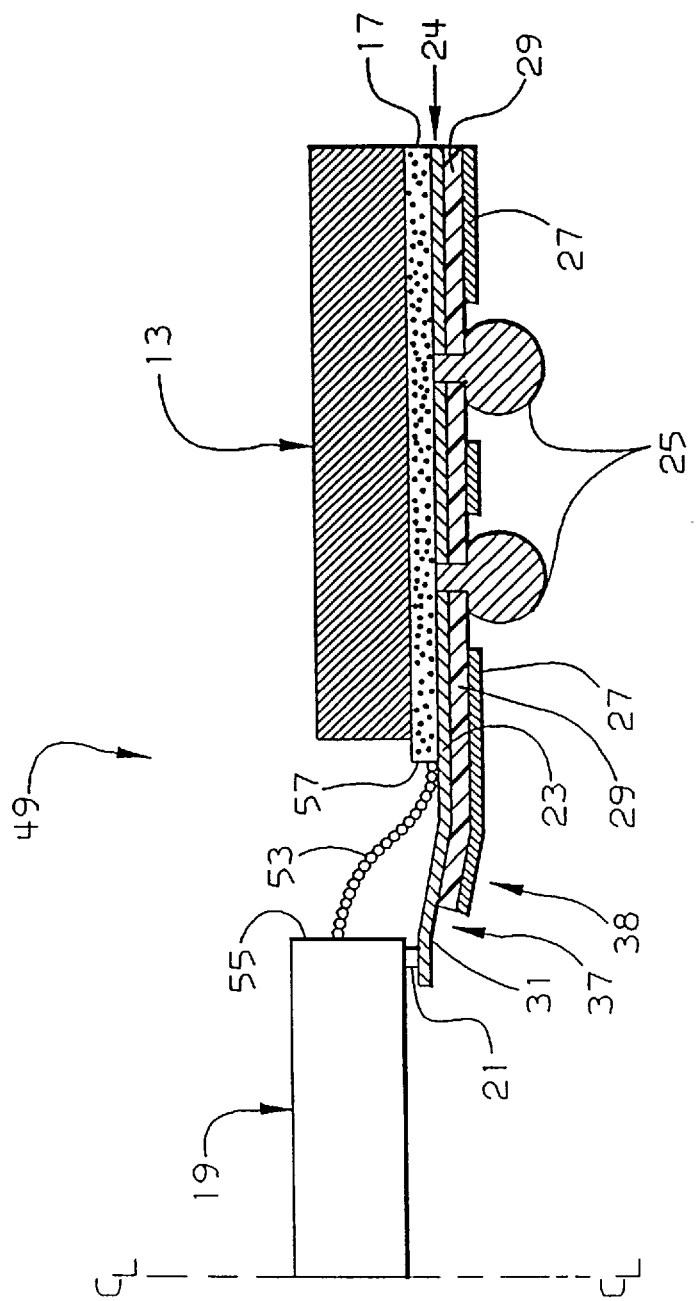
FIG. 5 is a partial side, sectional view of an electronic package in accordance with an embodiment of the invention, wherein a forming means is shown which is capable of forming the protective coating on the semiconductor device in a predetermined shape.
Figure 6:
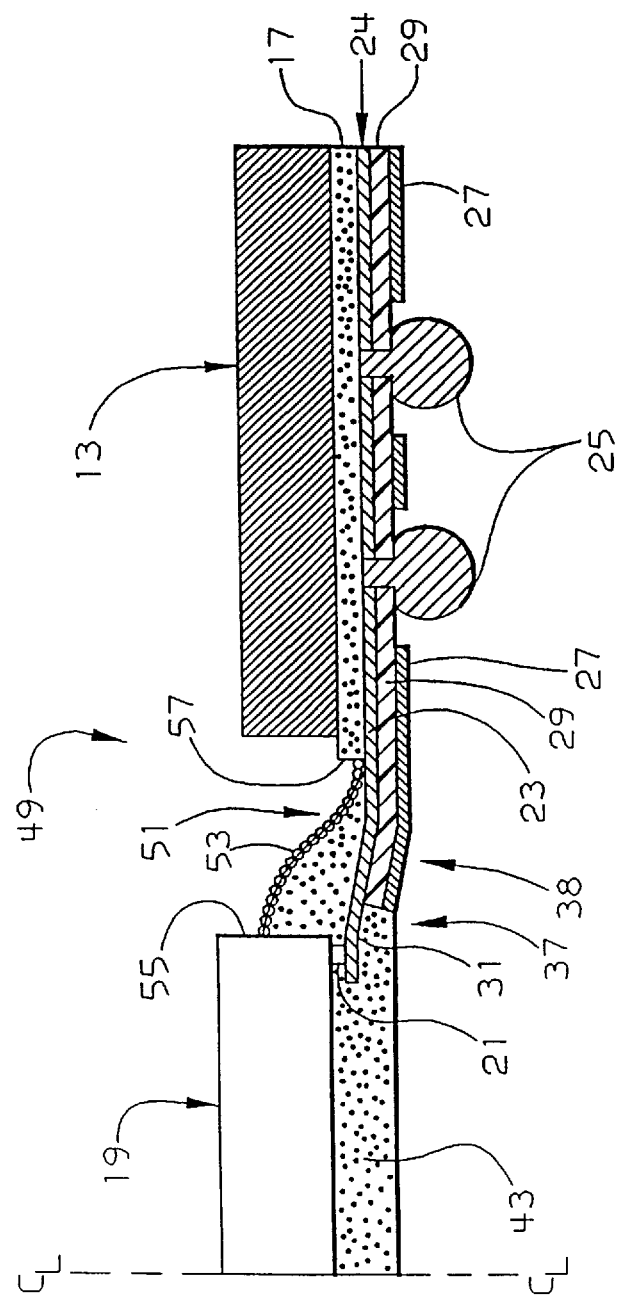
FIG. 6 is a partial side, sectional view of an electronic package as shown in FIG. 5, including a tapered protective coating on the semiconductor device and parts of the invention's flexible substrate.

Dispensing encapsulant material 43 into a sharp fillet 45 (FIG. 3) is caused when using today's dispensing processes/apparatus and typical low viscosity uncured encapsulant materials. To obtain the desired tapered fillet 51 with said material, forming means 53 (FIG. 5) is used. Forming means 53 (depicted in FIG. 5 without encapsulant material 43 having been dispensed) comprises a woven mesh collar form member 54 frictionally pressed in place around chip 19. Typical material suitable for form member 53 include open-woven stranded nylon (0.5 to 1 mil thick), pressed into the depicted shape, to which the uncured encapsulant material 43 (FIG. 6) will wet. As the viscous, uncured encapsulant material is dispensed, capillary action of the mesh pulls material 43 into the desirable shape of a tapered fillet 51. Leaving the form member 53 in place, the encapsulant material 43 is then thermally cured into solid form, as depicted in FIG. 6. The open weave of the collar used as forming means 53 allows gases to escape from the encapsulant during thermal cure. The rectangular form member 53 includes a central rectangular opening designed to precisely conform to the rectangular chip's perimeter 55, and an outer, rectangular edge designed to conform to adhesive 17's inner edge 57. Contact with the stiffener's adhesive 17 holds the form member 53 in place during encapsulant dispense and curing.

In FIG. 7, an improved electronic package 59 is depicted, utilizing strain relief means 37, second dielectric layer 41, and a gradually tapered fillet 51 (including mesh 54 which remains as part of package 59). Additionally, a heat sinking member 61 is attached. Typical known materials for member 61 include copper and aluminum, or alloys thereof Copper materials are typically plated with nickel for corrosion resistance and aluminum materials are typically anodized. It is known, however, that poor adhesion often occurs between many known thermal epoxies and nickel-plated material. To enhance adhesion, the heatsink of the invention preferably includes a plurality of channels 63 which serve to increase heatsink surface area while increasing the effective adhesion strength. Channels 63 may be used to increase adhesion strength of adhesive used over the chip 19 (thermal adhesive 65), over the stiffener 13 (stiffener adhesive 67), or both. Channels 63 may be cut, stamped, or etched into the heatsink, depending on the most economical method available. Obtaining a channel depth of 1 to 2 mils with a channel width of 2 to 3 mils has resulted in a significant increase in the effective adhesion strength. Several patterns of the channels 63 on the face of heatsink 61 have been evaluated and found to be acceptable, including parallel, crisscross, radial, circular, curved, herringbone, and overlapped crossings at angles to form small pillars, posts, or raised areas. Thus, the pattern of the channels is not particularly important for increasing strength, but the use of a radially oriented pattern originating at the approximate center of the corresponding chip 19 may help to promote complete filling of the channels with adhesive as the heatsink 61 is pressed onto the uncured adhesives 65 and 67 (toward chip 19).

To significantly reduce shear strain in the thermal adhesive located between the chip and heatsink, a general increase in thickness of the adhesive may prove to be effective. However, a general increase in thickness decreases thermal transfer efficiency. It has been found that strain relief means 69 can be built into heatsink 61 by thinning a portion of the heatsink in regions adjacent the chip's perimeter 55. Thus, a thin layer of adhesive 65 is used over most of the chip 19 (promoting beneficial thermal transfer between the chip and heatsink), with a thicker layer of adhesive near the chip perimeter 55 to relieve thermal strain (such strain is highest near the chip perimeter 55). Typical thickness for known thermal adhesives are 1–8 mils, and it has been found that significant strain reduction is obtained by at least doubling the nominal adhesive thickness near the chip perimeter using strain relief means 69. In one example, a nominal adhesive thickness of 3 mils over chip 19 which gradually increased to 6–8 mils in regions near the chip perimeter proved successful. This outer thickness may be as high as 5 to 10 times the nominal internal thickness, and may extend about 15 to 30 mils from the chip's perimeter (to the right in FIG. 7). The fabrication operations used to form channels 63 may be used to form strain relief means 69, with stamping being particularly convenient as the channels 63 and strain relief means 69 may be simultaneously stamped into the heatsink.

In FIG. 7, the improved electronic package is further enhanced by including a tab portion 71 along the outer peripheral portion of stiffener 13'. This tab is shown interlocking with a corresponding slot 73 formed in heatsink 61. The improvement of stiffener 13' over stiffener 13 (as depicted in previous figures) by including tab portion 71 provides added positive retention of the heatsink to the rest of the electronic package, providing further stress relief to the thermal adhesives 65 and 67 (useful prior to curing of the adhesives), which can be particularly important if a relatively heavy heatsink 61 is utilized. Tab portion 71 can be of two types: permanently deformable or spring-locking; the choice primarily being economic. It has been found that using an extension of the stiffener, formed by stamping it approximately 10 mils thick at several locations about the outer edge of the stiffener, provides sufficient material to bend around onto corresponding slot features 73 of the retained heatsink.

Thus there has been shown and described an improved electronic package in which strain relief means are provided to substantially prevent adverse conditions such as tape "wrinkling" should excessive CTE differentials exist. The modifications are readily possible using many known processes and thus do not significantly increase the final cost of the finished product.

While there have been shown and described what are at present considered the preferred embodiments of the invention, it is understood that various modifications and changes may be made thereto without departing from the scope of the invention as defined by the appended claims.

We claim:

1. A method of making an electronic package comprising the steps of:

providing a stiffener member;

securing a flexible circuitized substrate to said stiffener member, said flexible circuitized substrate including at least one dielectric layer and at least one conductive layer located on said dielectric layer and further including a plurality of signal lines, selected ones of said signal lines having a projecting lead portion which projects a predetermined distance from said dielectric layer and is adapted for being electrically coupled to respective ones of external conductive elements when said external conductive elements are positioned on said flexible circuitized substrate;

providing strain relief means in said projecting lead portions of said signal lines of said flexible circuitized substrate; and spacedly positioning a semiconductor device relative to said stiffener member and electrically coupling said semiconductor device to said projecting lead portions of said flexible circuitized substrate at a location, said strain relief means being positioned at a location relative to the location of said electrical coupling between said semiconductor device and said projecting lead portions of said signal lines.

2. The method of claim 1 further including providing a heat sinking member and thereafter securing said stiffener member to said heat sinking member.

3. The method of claim 2 further including securing said semiconductor device to said heat sinking member.

4. The method of claim 3 wherein said stiffener member and said semiconductor device are secured to said heat sinking member using a thermal adhesive.

5. The method of claim 1 wherein said step of providing said strain relief means in said flexible circuitized substrate comprises providing an indentation within said flexible circuitized substrate substantially simultaneously with the step of electrically coupling said projecting lead portions of said substrate to said semiconductor device.

6. The method of claim 5 wherein said indentation and said electrical coupling are provided using thermal compression bonding.

7. The method of claim 1 wherein said step of providing said strain relief means in said flexible circuitized substrate comprises providing a moderated thermal expansivity region in said flexible circuitized substrate relative to said chip.

8. The method of claim 1 further including providing a plurality of said conductive elements and electrically coupling said conductive elements to said respective ones of said signal lines of said conductive layer of said flexible circuitized substrate.

9. The method of claim 1 further including providing a quantity of encapsulant material to substantially cover said conductive layer at the location of said flexible circuitized substrate between said semiconductor device and said stiffener member.

10. The method of claim 1 further including providing a form member about said semiconductor device and substantially between said device and said stiffener member, said form member substantially defining part of the configuration of said encapsulant material.

11. The method of claim 1 further including providing a second layer of dielectric material on said conductive layer of said flexible circuitized substrate except for said projecting lead portions of said signal lines.

12. The method of claim 11 further including providing a feathered edge portion within said second layer of dielectric material.

13. The method of claim 11 further including providing a quantity of encapsulant material to substantially cover said second layer of dielectric material at the location of said flexible circuitized substrate between said semiconductor device and said stiffener member.

14. The method of claim 4 further including providing strain relief means within said heat sinking member substantially at the location where said semiconductor device is secured to said heat sinking member.

15. The method of claim 4 further including providing a plurality of channels within said heat sinking member for having at least some of said thermal adhesive therein.

* * * * *